(12) United States Patent
Oh et al.

(10) Patent No.: US 11,139,251 B2
(45) Date of Patent: Oct. 5, 2021

(54) SEMICONDUCTOR PACKAGE

(71) Applicant: SAMSUNG ELECTRONICS CO., LTD., Suwon-si (KR)

(72) Inventors: Dongjoon Oh, Suwon-si (KR); Sukho Lee, Suwon-si (KR); Jusuk Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/592,131

(22) Filed: Oct. 3, 2019

(65) Prior Publication Data

US 2020/0152582 A1 May 14, 2020

(30) Foreign Application Priority Data

Nov. 13, 2018 (KR) .................. 10-2018-0139087

(51) Int. Cl.
| | |
|---|---|
| *H01L 23/552* | (2006.01) |
| *H01L 23/495* | (2006.01) |
| *H01L 23/00* | (2006.01) |
| *H01L 23/31* | (2006.01) |

(52) U.S. Cl.
CPC ........ *H01L 23/552* (2013.01); *H01L 23/3157* (2013.01); *H01L 23/49534* (2013.01); *H01L 24/09* (2013.01); *H01L 2224/02372* (2013.01); *H01L 2224/02377* (2013.01); *H01L 2224/02379* (2013.01)

(58) Field of Classification Search
CPC ............... H01L 23/552; H01L 23/3157; H01L 23/49534; H01L 24/09; H01L 21/561; H01L 23/3135; H01L 23/3128
USPC .................................................. 257/659, 660
See application file for complete search history.

(56) References Cited

U.S. PATENT DOCUMENTS

| | | | |
|---|---|---|---|
| 2018/0000260 A1* | 1/2018 | Huang et al. ....... | H01L 25/0657 257/659 |
| 2018/0077802 A1 | 3/2018 | Kidoguchi | |

FOREIGN PATENT DOCUMENTS

KR          10-1247719 B1     3/2013

* cited by examiner

*Primary Examiner* — Thinh T Nguyen
(74) *Attorney, Agent, or Firm* — Sughrue Mion, PLLC

(57) ABSTRACT

A semiconductor package includes a semiconductor chip having an active surface on which a connection pad is disposed and an inactive surface opposing the active surface, a first encapsulant covering at least portions of the inactive surface and a side surface of the semiconductor chip, a connection structure having first and second regions disposed sequentially on the active surface of the semiconductor chip, and including a redistribution layer electrically connected to the connection pad of the semiconductor chip and including a ground pattern layer, and a metal layer disposed on the upper surface of the first encapsulant, and extending from the upper surface of the first encapsulant to the side surface of the first region of the connection structure. The first region of the connection structure has a first width, and the second region has a second width, smaller than the first width.

20 Claims, 14 Drawing Sheets

I-I'

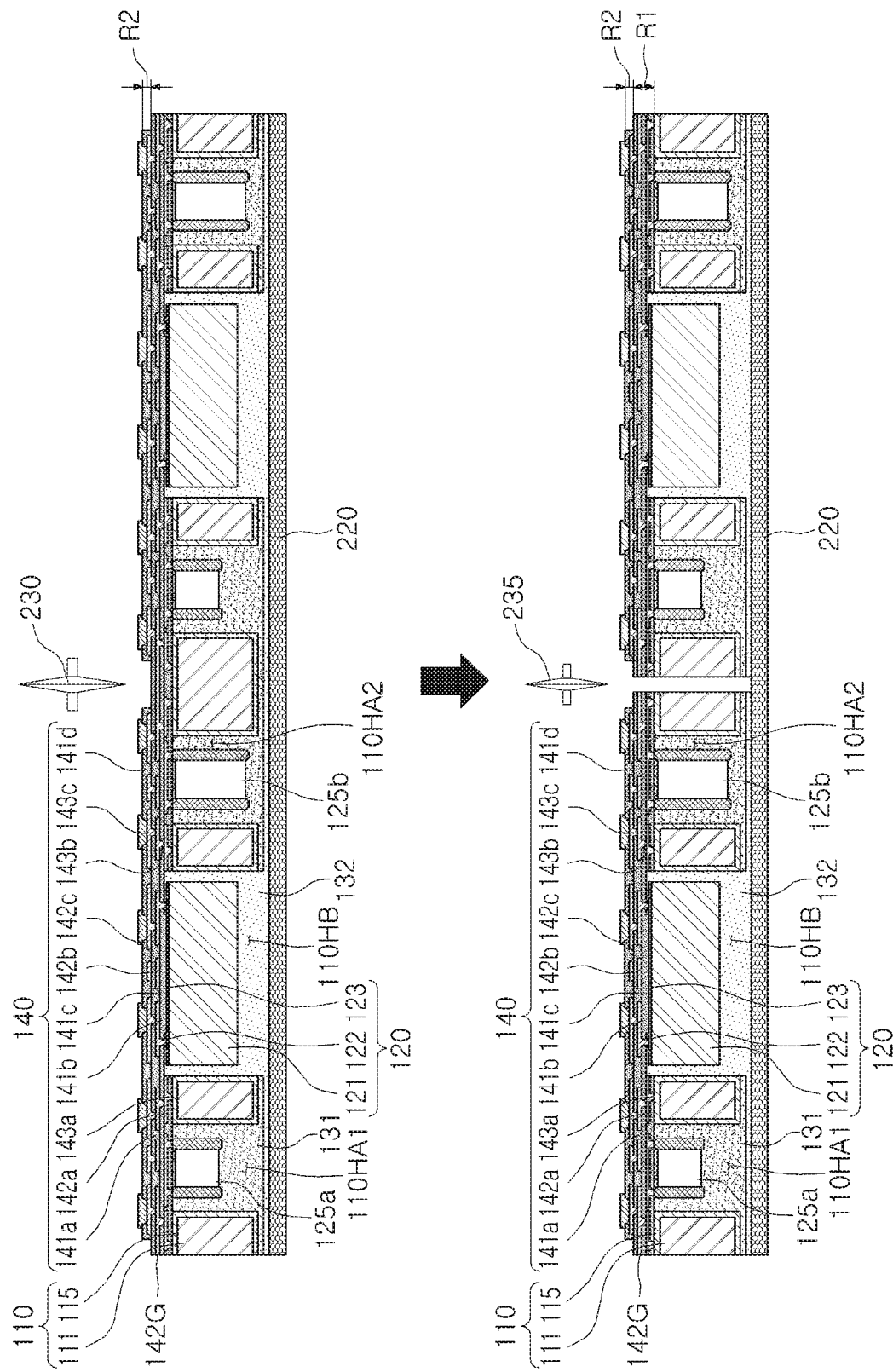

SEMICONDUCTOR PACKAGE

CROSS-REFERENCE TO RELATED APPLICATION(S)

This application claims benefit of priority to Korean Patent Application No. 10-2018-0139087 filed on Nov. 13, 2018 in the Korean Intellectual Property Office, the disclosure of which is incorporated herein by reference in its entirety.

TECHNICAL FIELD

The present disclosure relates to a semiconductor chip, for example, to a fan-out semiconductor package.

BACKGROUND

As an electronic device becomes smaller and performance thereof becomes higher, a distance between components becomes closer and operating speeds are greatly increased. As a result, a problem of malfunctioning of the device due to electromagnetic wave interference between components has been an issue. Recently, interest in electromagnetic shielding technologies has been growing. In the case of smartphones, electromagnetic shielding technology has only been applied to only some chips such as an initial communication chip, however, recently, the application of electromagnetic shielding technology has been expanding to AP, RF chips, and the like.

As an electromagnetic wave shielding technology, a metal can structure or a deposition method such as sputtering is mainly used. When the deposition method such as sputtering is used, since a sputtering layer is formed even on a lower surface of the package according to formation of an EMI shielding layer after singulation of the semiconductor package, defects such as appearance defects, solder balls, electrical shorts, or the like may occur, and EMI shielding characteristics may be deteriorated.

SUMMARY

An aspect of the present disclosure is to provide a semiconductor package with significantly reduced defect occurrence and improved shielding performance.

According to an aspect of the present disclosure, in a semiconductor package, a connection structure is formed in multiple stages, and an EMI shielding layer is formed so as not to extend to a lower end.

For example, a semiconductor package may include: a semiconductor chip having an active surface on which a connection pad is disposed and an inactive surface opposing the active surface; a first encapsulant covering at least portions of each of the inactive surface and a side surface of the semiconductor chip; a connection structure having a first region and a second region sequentially disposed on the active surface of the semiconductor chip, and including a redistribution layer electrically connected to the connection pad of the semiconductor chip and including a ground pattern layer; and a metal layer disposed on an upper surface of the first encapsulant and extending from the upper surface of the first encapsulant to a side surface of the first region of the connection structure. The first region of the connection structure has a first width, and the second has a second width, smaller than the first width.

BRIEF DESCRIPTION OF DRAWINGS

The above and other aspects, features, and advantages of the present disclosure will be more clearly understood from the following detailed description taken in conjunction with the accompanying drawings, in which:

FIGS. 11A to 11D are schematic process drawings illustrating a manufacturing example of the semiconductor package of FIG. 9;

DETAILED DESCRIPTION

Hereinafter, embodiments of the present disclosure will be described as follows with reference to the attached drawings.

Electronic Device

Figure 1:
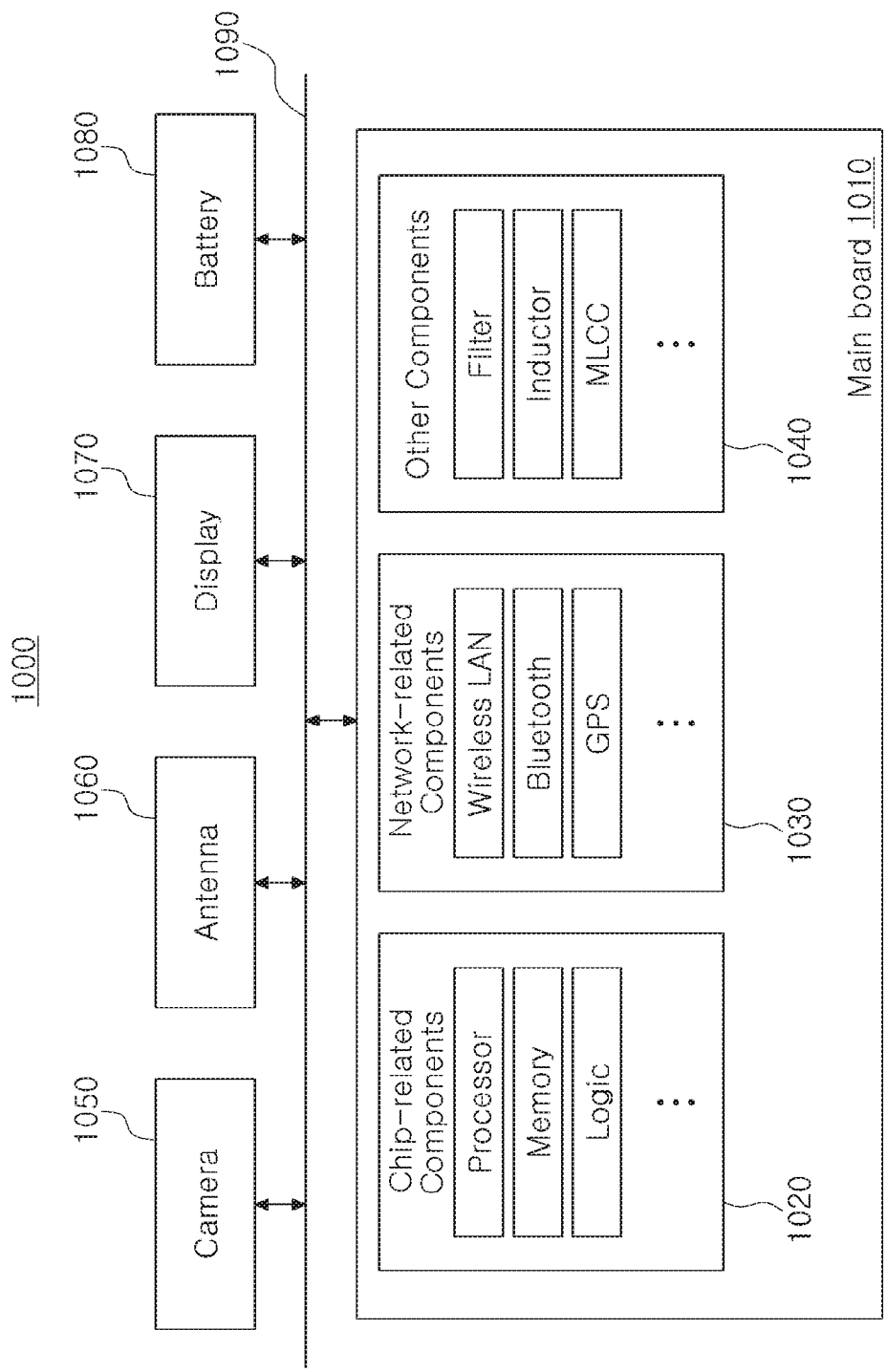
FIG. 1 is a schematic block diagram illustrating an example of an electronic device system.

FIG. 1 is a schematic block diagram illustrating an example of an electronic device system.

Referring to FIG. 1, an electronic device 1000 may receive a motherboard 1010. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
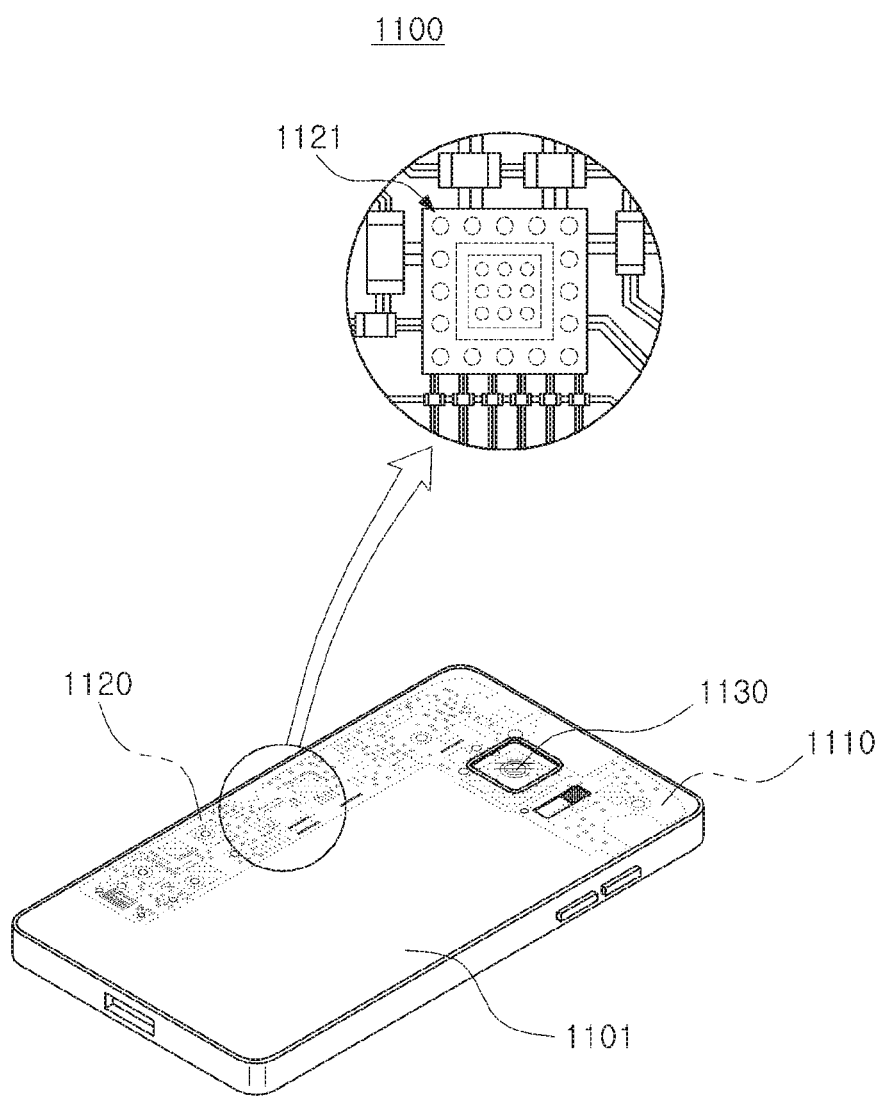
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
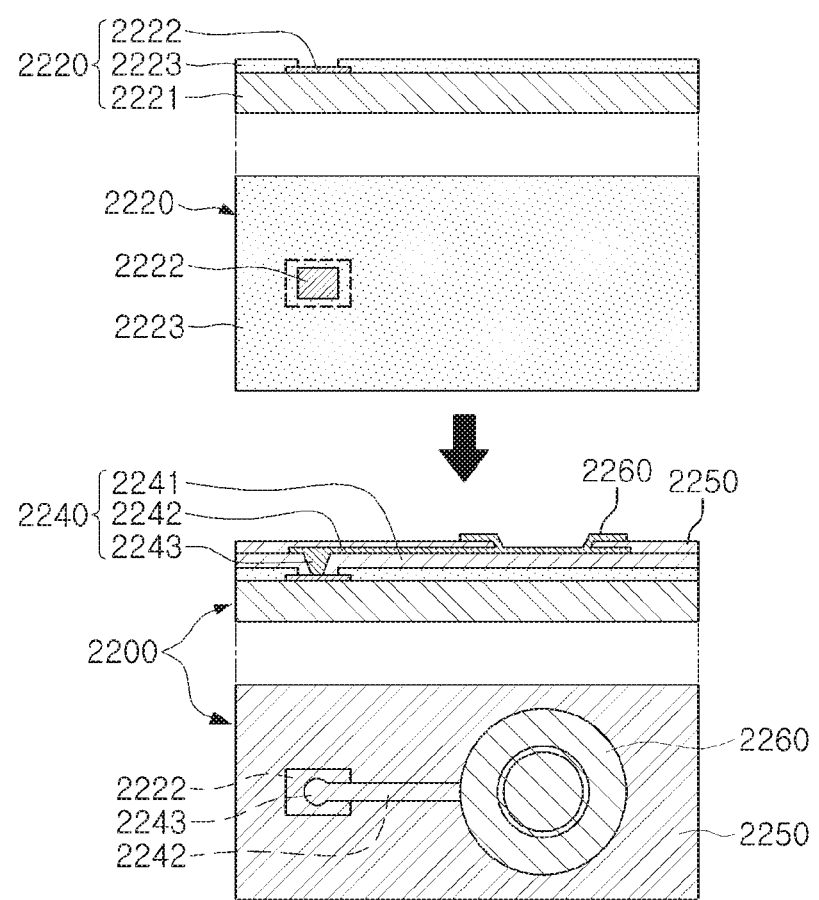
FIGS. 3A and 3B are schematic cross-sectional views illustrating states of a fan-in semiconductor package before and after being packaged.
Figure 3B:
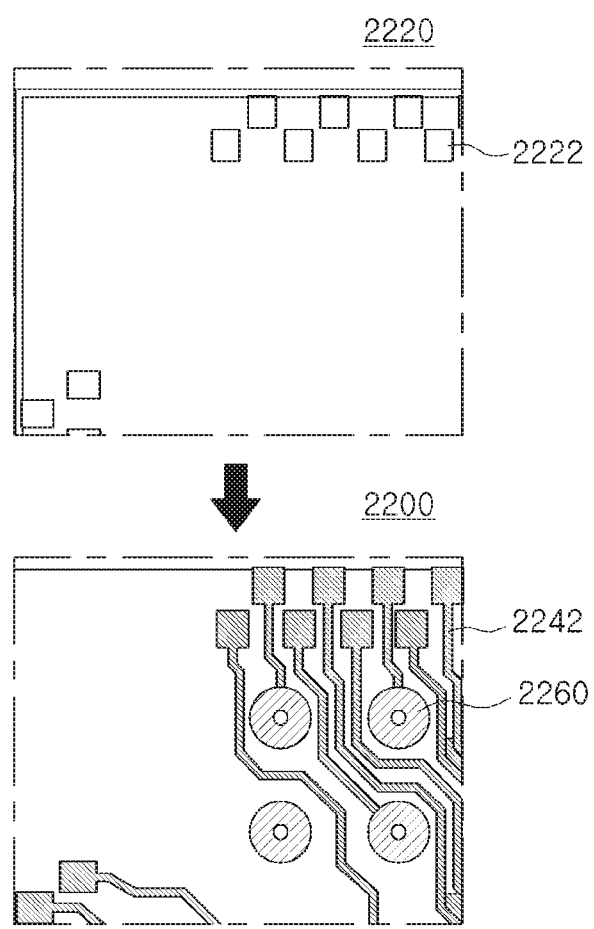

FIGS. 3A and 3B are schematic cross-sectional views illustrating states of a fan-in semiconductor package before and after being packaged.

Figure 4:
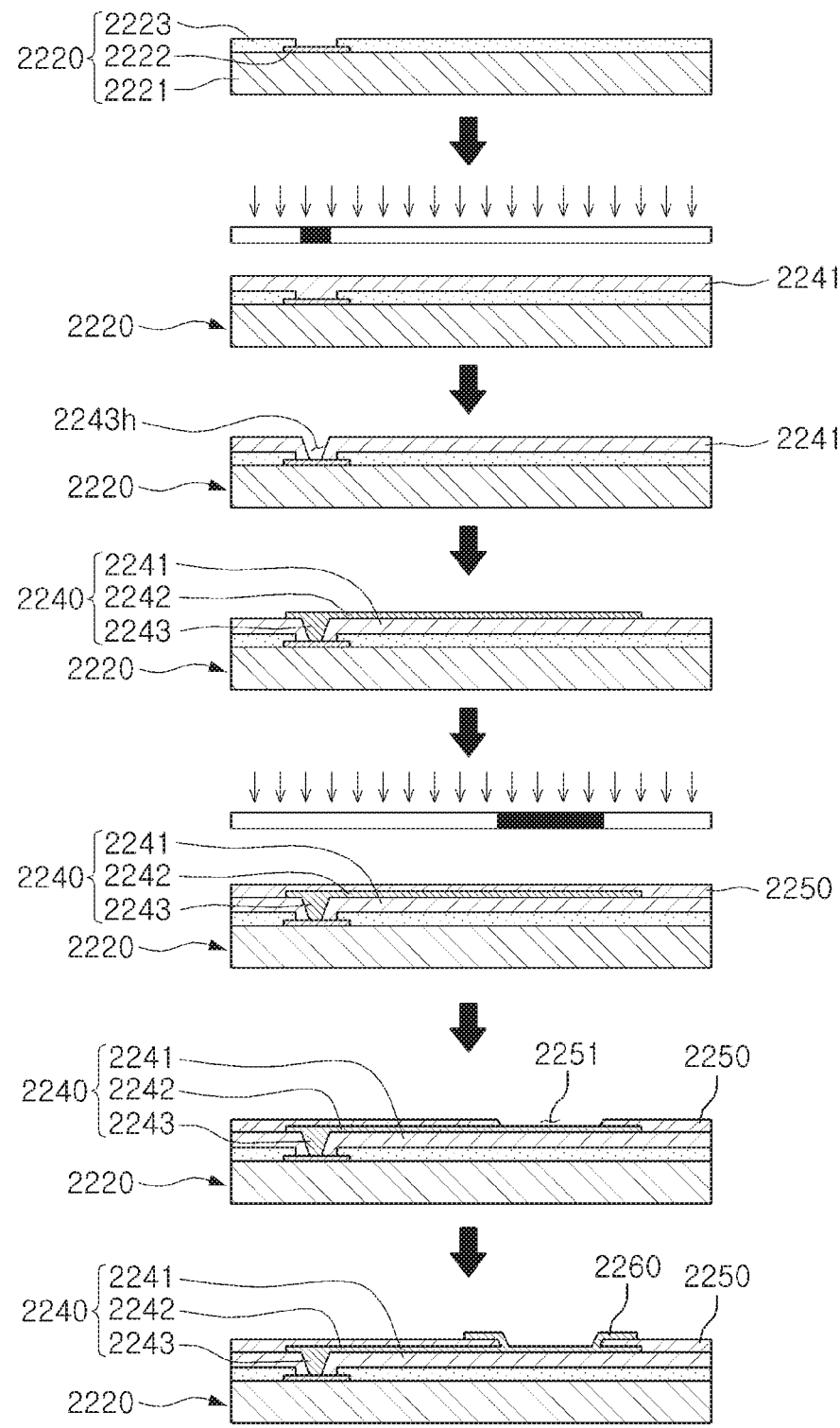
FIG. 4 is a schematic cross-sectional view illustrating a packaging process of a fan-in semiconductor package.

FIG. 4 is a schematic cross-sectional view illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
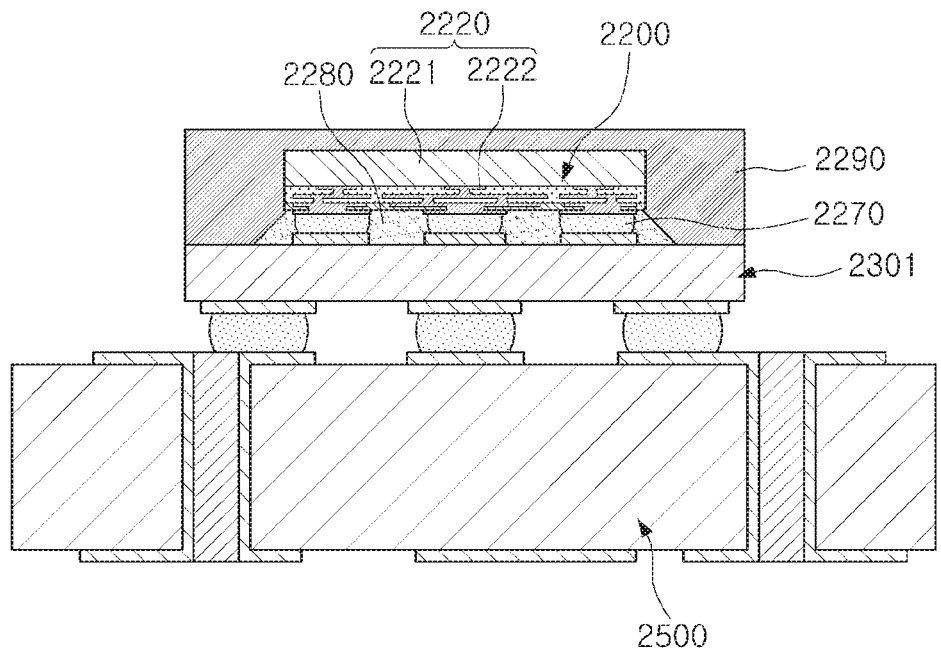
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
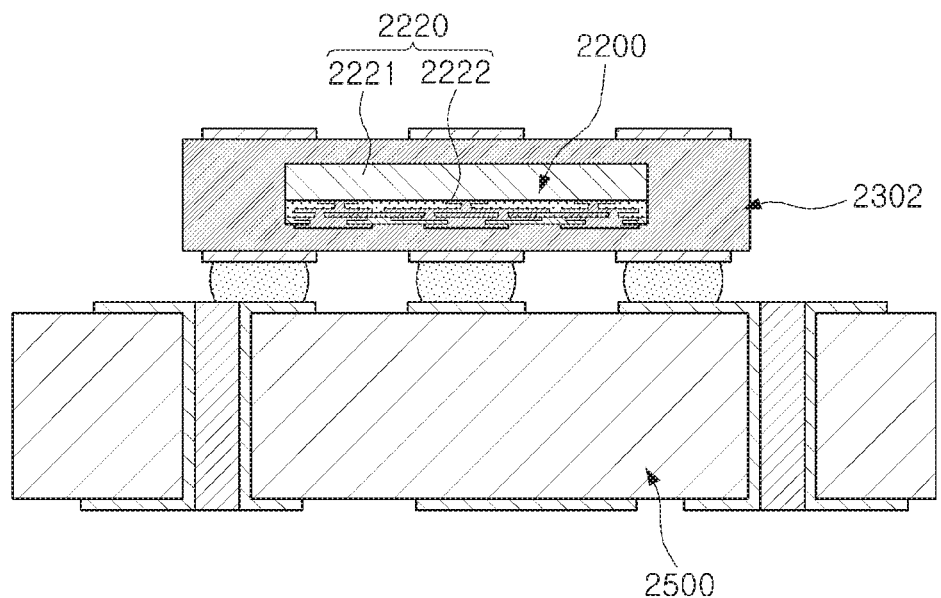
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
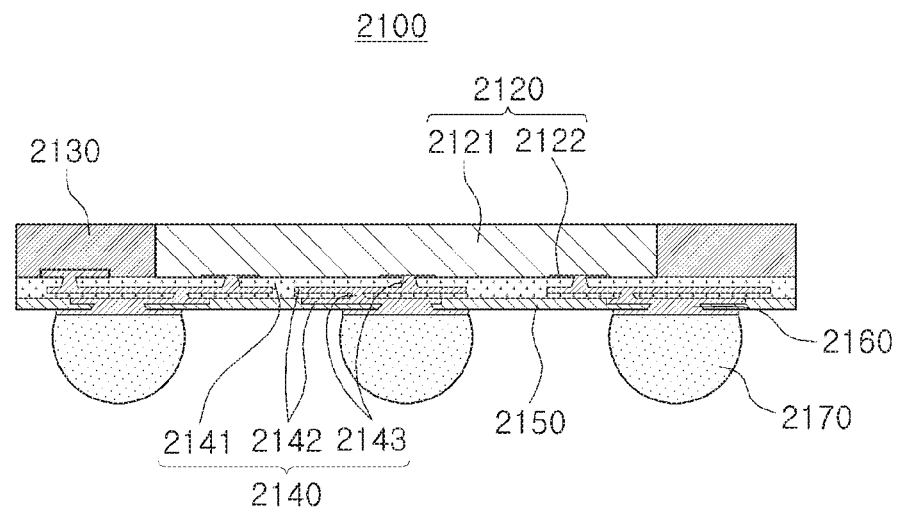
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2202 may further be formed on the connection structure 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
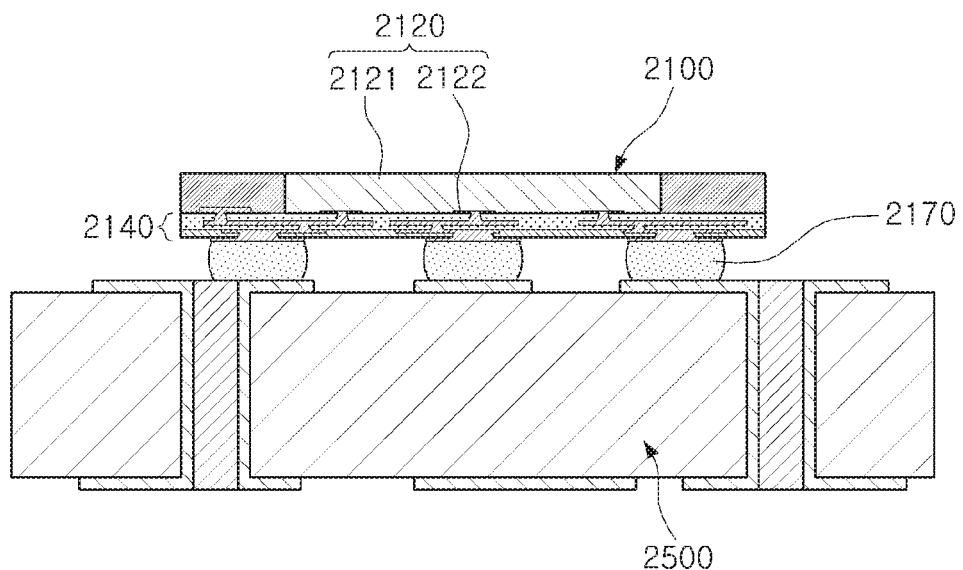
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, a semiconductor package including a metal layer for electromagnetic wave shielding will be described with reference to the drawings.

Figure 9:
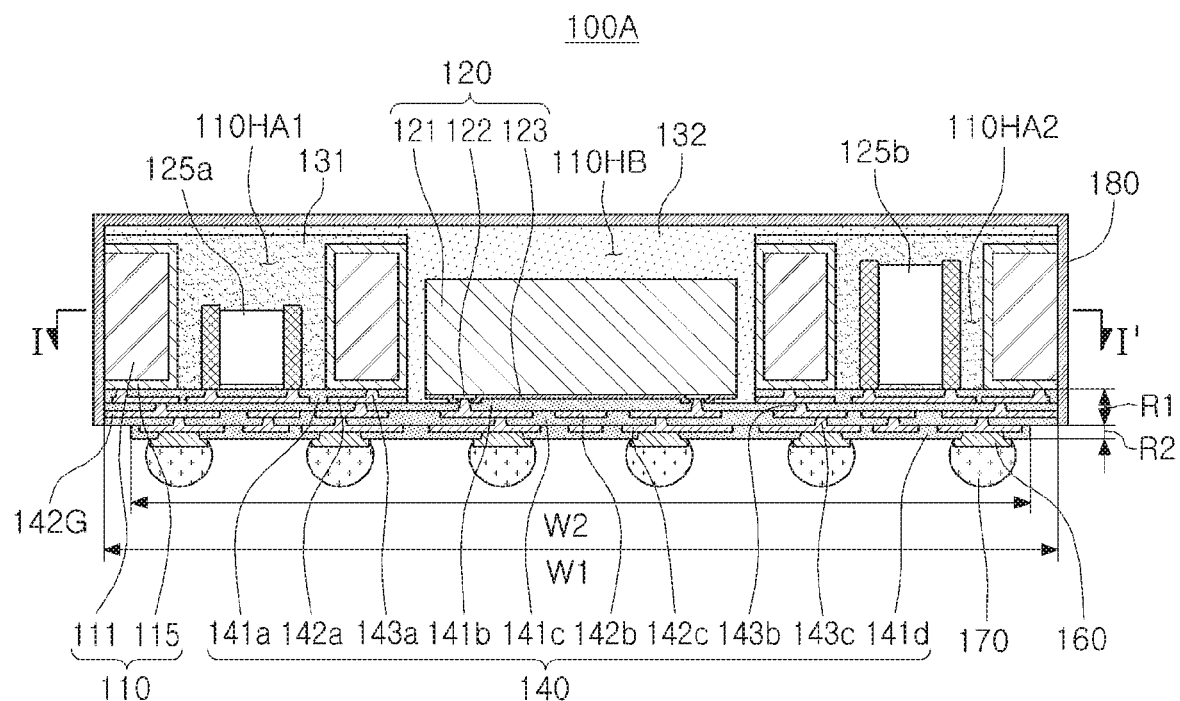
FIG. 9 is a schematic cross-sectional view illustrating an example of a semiconductor package.

FIG. 9 is a schematic cross-sectional view illustrating an example of a semiconductor package.

Figure 10:
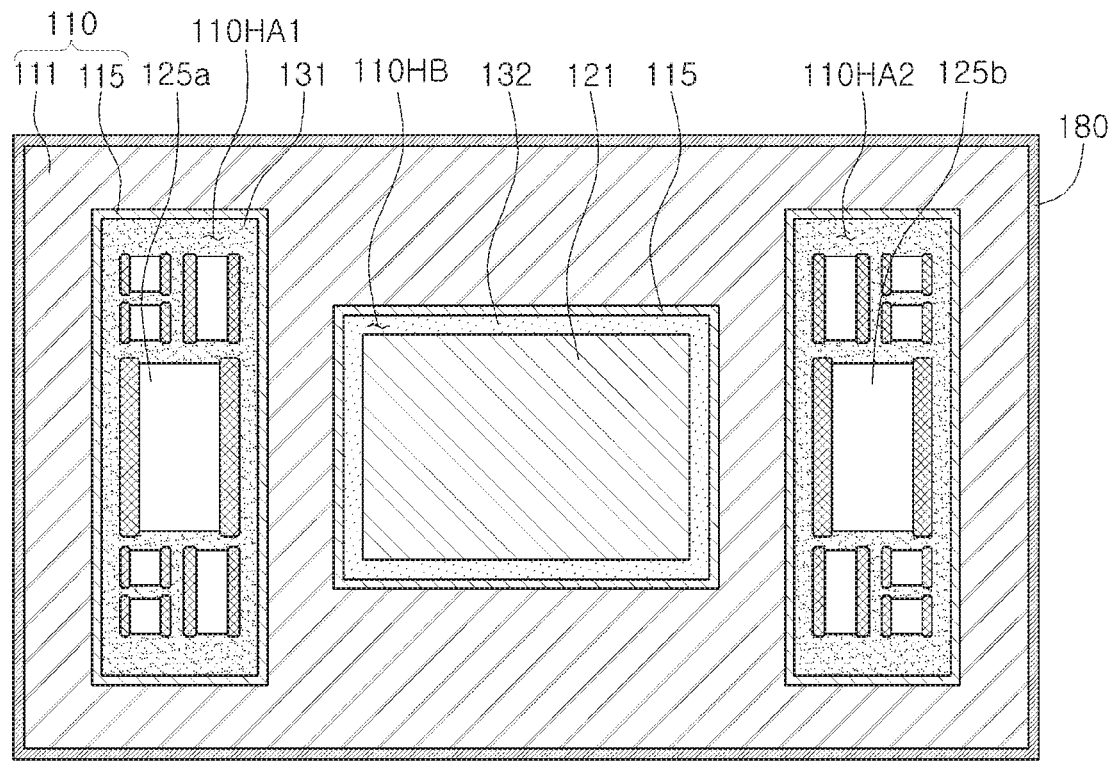
FIG. 10 is a schematic plan view taken along line I-I' of the semiconductor package of FIG. 9.

FIG. 10 is a schematic plan view taken along line I-I' of the semiconductor package of FIG. 9.

Referring to FIGS. 9 and 10, a semiconductor package 100A according to an embodiment may include a frame 110 having first through-holes 110HA1 and 110HA2 and a second through-hole 110HB, at least one passive component 125a and at least one passive component 125b disposed in the first through-holes 110HA1 and 110HA2 of the frame 110, a semiconductor chip 120 disposed in the second through-hole 110HB of the frame 110, and having an active surface on which a connection pad 122 is disposed and an inactive surface opposing the active surface, a first encapsulant 131 encapsulating at least portions of the frame 110 and the passive components 125a and 125b, a second encapsulant 132 encapsulating at least portions of the frame 110 and the semiconductor chip 120, a connection structure 140 disposed on lower surfaces of the frame 110 and the passive components 125a and 125b and on the active surface of semiconductor chip 120, and having a multistep structure, an underbump metal layer 160 disposed on an opening of the connection structure 140, an electrical connection metal 170 disposed on the connection structure 140 and connected to the underbump metal layer 160, and a metal layer 180 disposed on an upper surface of the second encapsulant 132 and extending downwardly from the upper surface of the second encapsulant 132 along aside surface of the semiconductor package 100A to cover a portion of a side surface of the connection structure 140.

The connection structure 140 may redistribute the connection pad 122 of the semiconductor chip 122. The connection structure 140 has first and second regions R1 and R2 sequentially disposed on the active surface of the semiconductor chip 120. The first and second regions R1 and R2 are regions having different widths from each other, and the upper first region R1 has a first width W1 and the lower second region R2 has a second width W2, smaller than the first width W1. Since the widths of the first and second regions R1 and R2 are different from each other, a stair-shape step may be formed at a boundary between the first and second regions R1 and R2. In the step region, a portion of a lower surface of the first region R1 may be exposed downwardly from the second region R2.

The connection structure 140 may include a first insulating layer 141a disposed on the frame 110 and the passive components 125a and 125b, a first redistribution layer 142a disposed on the first insulating layer 141a, a first via 143a connecting the first redistribution layer 142a, the passive components 125a and 125b, and a frame metal layer 115, a second insulating layer 141b disposed on the first insulating layer 141a, a second redistribution layer 142b disposed on the second insulating layer 141b, a second via 143b penetrating the second insulating layer 141b and connecting the first and second redistribution layers 142a and 142b or connecting the connection pad 122 of the semiconductor chip 120 and the second redistribution layer 142b, a third insulating layer 141c disposed on the second insulating layer 141b, a third redistribution layer 142c disposed on the third insulating layer 141c, a third via 143c penetrating the third insulating layer 141c and connecting the second and third redistribution layers 142b and 142c, and a fourth insulating layer 141d disposed on the third insulating layer 141c. The first and second regions R1 and R2 of the connection structure 140 may include at least one redistribution layer 142a, 142b, and 142c, respectively. In addition, the first and second regions R1 and R2 of the connection structure 140 may include at least one insulating layer 141a, 141b, 141c, and 141d, respectively. For example, the upper first region R1 may include the first and second redistribution layers 142a and 142b and the first to third insulating layers 141a, 141b, and 141c, and the lower second region R2 may include the third redistribution layer 142c and the fourth insulating layer 141d. In this case, the thickness of the first region R1 may be thicker than the thickness of the second region R2, but is not limited thereto.

The metal layer 180 may be disposed outside of the package so as to form portions of the upper surface and the side surface of the semiconductor package 100A. The metal layer 180 may cover the upper surface of the second encapsulant 132, and extend downward along an outer side surface of the package. The metal layer 180 may extend from a lower portion to the first region R1 to cover the side surface of the first region R1, and may not extend to the second region R2 and thus may expose the side surface of the second region R2. The metal layer 180 may be directly connected to a ground pattern layer 142G on the side surface of the first region R1, thereby receiving a ground signal.

As described above, a deposition method such as sputtering is mainly used as an electromagnetic wave shielding technology. In this case, since a metal layer for EMI shielding is formed after a singulation process, there is a problem that defects occur when the metal layer is deposited on the lower surface of the metal layer to which an electrical connection metal is attached. Therefore, it has been difficult to optimize conditions such that the metal layer is not deposited on the lower surface of the package.

On the other hand, in the semiconductor package 100A according to an example, as described below with reference to FIGS. 11A to 11D, by performing the singulation divided into a plurality of steps, the connection structure 140 may be formed to have the first and second regions R1 and R2, and then the metal layer 180 is formed. Therefore, a process may be simplified because a step of the connection structure 140 may easily adjusted such that the metal layer 180 is not deposited on the second region R2 and the lower surface. In addition, since the metal layer 180 is not deposited on the lower surface of the connection structure 140 or the package 100A, it is possible to prevent defects such as appearance defects and electrical defects caused when the metal layer 180 is deposited.

Each configuration included in the semiconductor package 100A according an example will hereinafter be described in more detail.

The frame 110 may improve rigidity of the semiconductor package 100A depending on certain materials, and serve to secure uniformity of thicknesses of the first and second encapsulants 131 and 132. The frame 110 has a plurality of first and second through-holes 110HA1 and 110HA2, and 110HB. The first and second through-holes 110HA1 and 110HA2, and 110HB may be disposed to be physically spaced apart from each other. The first through-holes 110HA1 and 110HA2 may penetrate the frame 110, and the passive components 125a and 125b may be disposed in the first through-holes 110HA1 and 110HA2. As illustrated in FIG. 10, the passive components 125a and 125b may be disposed to be spaced apart from wall surfaces of the first through-holes 110HA1 and 110HA2 by a predetermined distance, and may be surrounded by the wall surfaces of the first through-holes 110HA1 and 110HA2, but is not limited thereto. The second through-hole 110HB may penetrate the frame 110 and the first encapsulant 131, and the semiconductor chip 120 may be disposed in the second through-hole 110HB. The semiconductor chip 120 may be disposed to be spaced apart from a wall surface of the second through-hole 110HB by a predetermined distance, and may be surrounded by the wall surface of the second through-hole 110HB. However, such a form is only an example and may be variously modified to have other forms, and another function may be performed depending on such a form. The frame 110 may be omitted if necessary, but the case having the frame 110 may be more advantageous in securing the board level reliability as intended in the present disclosure.

The frame 110 may include a frame insulating layer 111 and a frame metal layer 115 surrounding the frame insulating layer 111. An insulating material may be used as the material of the frame insulating layer 111. In this case, the insulating material may be a thermosetting resin such as an epoxy resin, a thermoplastic resin such as a polyimide resin, an insulating material in which the thermosetting resin or the thermoplastic resin is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Such a frame 110 may serve as a supporting member.

The frame metal layer 115 may be disposed in an inner side wall of each of the first through-holes 110HA1 and 110HA2 and the second through-hole 110HB. As illustrated in FIG. 10, the frame metal layer 115 may surround each of the passive components 125a and 125b, and the semiconductor chip 120. The frame metal layer 115 may be introduced to improve an electromagnetic interference (EMI) shielding effect and a heat dissipation effect of the passive components 125a and 125b and the semiconductor chip 120. The frame metal layer 115 may include a conductive material such as copper (Cu), aluminum (Al), silver (Ag), tin (Sn), gold (Au), nickel (Ni), lead (Pb), titanium (Ti), or alloys thereof. The frame metal layer 115 may be formed using a plating process, and may be formed of a seed layer and a conductor layer. The frame metal layer 115 may be used as a ground. In this case, the frame metal layer may be electrically connected to a ground pattern layer 142G in the connection structure 140.

The semiconductor chip 120 may be an integrated circuit (IC) provided in an amount of several hundred to several million or more elements integrated in a single chip. The IC may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like, but is not limited thereto Moreover, these chip related components are also combined.

In the semiconductor chip 120, a side, on which connection pad 122 is disposed, is an active surface, and the opposite side is an inactive surface. The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like without particular limitation. A passivation film 123 exposing the connection pads 122 may be formed on the body 121, and may be an oxide film, a nitride film, or the like, or a double layer of an oxide film and a nitride film.

Each of the passive components 125a and 125b may be a capacitor such as a multilayer ceramic capacitor (MLCC) or a low inductance chip capacitor (LICC), an inductor such as a power inductor, a bead, or the like, independently. The passive components 125a and 125b may have different sizes and thicknesses. Moreover, each of the passive components 125a and 125b may have a thickness different from a thickness of the semiconductor chip 120. In the semiconductor package 100A according to an embodiment, the passive components 125a and 125b and the semiconductor chip 120 are encapsulated in different processes, so a problem of defects due to such thickness variations may be significantly reduced. The number of the passive components 125a and 125b are not particularly limited, and may be more or less than that illustrated in the drawings.

Meanwhile, in one example, the passive components 125a and 125b, disposed in parallel with the semiconductor chip 120 may form one component built-in structure. The component built-in structure may include the passive components 125a and 125b, the frame 110, the first encapsulant 131, the first insulating layer 141a, the first redistribution layer 142a, and the first via 143 of the connection structure 140. According to embodiments, the frame 110 in the component built-in structure may be omitted, and in this case, the metal layer 180 may be formed to cover an outer side surface of the first encapsulant 131.

The first encapsulant 131 may fill at least portions of the first through-holes 110HA1 and 110A2, and may encapsulate one or more passive components 125a and 125b. An encapsulation form may not be particularly limited, but may be a form covering at least portions of the passive components 125a and 125b. The first encapsulant 131 may cover at least portions of upper surfaces and lower surfaces of the passive components 125a and 125b, and may fill at least a portion of a space between wall surfaces of the first through-holes 110HA1 and 110HA2 and side surfaces of the plurality of passive components 125a and 125b. The first encapsulant 131 may extend to the frame 110 to be disposed on the frame 110, and may be in contact with an upper surface of the frame metal layer 115.

The second encapsulant 132 may fill at least a portion of the second through-hole 110HB, and may encapsulate the semiconductor chip 120. An encapsulation form is not particularly limited, but may be a form surrounding at least a portion of the semiconductor chip 120. For example, the second encapsulant 132 may cover at least portions of the frame 110 and the inactive surface of the semiconductor chip 120, and may fill at least a portion of a space between a wall surface of the second through-hole 110HB and a side surface of the semiconductor chip 120. Meanwhile, the second encapsulant 132 may fill the second through-hole 110HB to thus serve as an adhesive for fixing the semiconductor chip 120 and reduce buckling at the same time, depending on certain materials. The second encapsulant 132 may be disposed in an upper portion of the semiconductor chip 120 as described above, may extend to upper portions of the passive components 125a and 125b and the frame 110, and may be disposed on the first encapsulant 131 on the passive components 125a and 125b and the frame 110. Thus, the first and second encapsulants 131 and 132 may be stacked sequentially and disposed on the passive components 125a and 125b and the frame 110. The second encapsulant 132 may be only one of the first encapsulant 131 and the second encapsulant 132 that is disposed on the semiconductor chip 120.

The first and second encapsulants 131 and 132 may include an insulating material. The insulating material may be a material containing an inorganic filler and an insulating resin, for example, a thermosetting resin such as an epoxy resin, a thermoplastic resin such as a polyimide, or a resin in which a reinforcement such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, an epoxy molding compound (EMC), a photo imageable encapsulant (PIE), or the like, may be used therefor. As needed, a material in which an insulating resin such as the thermosetting resin or the thermoplastic resin is impregnated in an inorganic filler together with a core material such as a glass fiber, may be used. The first and second encapsulants 131 and 132 may include the same or different materials.

The connection pad 122 of several tens to hundreds of semiconductor chips 120 having various functions may be redistributed through the connection structure 140, and may be physically and/or electrically externally connected through the electrical connection metal 170 depending on the functions. The connection structure 140 may include the number of insulating layers, redistribution layers, and vias, greater than illustrated in the drawings.

A material of each of the insulating layers 141a, 141b, 141c, and 141d may be an insulating material. In this case, a photosensitive insulating material such as a PID resin may also be used as the insulating material besides the aforementioned insulating materials. In other words, each of the insulating layers 141a, 141b, 141c, and 141d may be a photosensitive insulating layer. In the case in which the insulating layers 141a, 141b, 141c, and 141d have photosensitive properties, thicknesses of the insulating layers 141a, 141b, 141c, and 141d may be formed to be thinner, and a fine pitch of the vias 143a, 143b, and 143c may be achieved more easily. Each of the insulating layers 141a, 141b, 141c, and 141d may be a photosensitive insulating layer including an insulating resin and an inorganic filler. In the case in which the insulating layers 141a, 141b, 141c, and 141d are multiple layers, materials of the insulating layers 141a, 141b, 141c, and 141d may be the same, or may be different from each other if necessary. In the case in which the insulating layers 141, 141b, 141c, and 141d are the multiple layers, the insulating layers 141a, 141b, 141c, and 141d may be integrated with each other depending on a process, such that a boundary therebetween may not be readily apparent. A larger number of insulating layers may be formed than is illustrated in the drawings.

In particular, the lowermost fourth insulating layer 141d may correspond to a passivation layer for protecting the connection structure 140 from external physical or chemical damage, or the like. The fourth insulating layer 141d may have an opening exposing at least a portion of the third redistribution layer 142c. The number of openings, formed in the fourth insulating layer 141d, may be several tens to several thousands. A material of the fourth insulating layer 141d may be the same as or different from that of other insulating layers 141a, 141b, and 141c. For example, an insulating material may be used as a material of the fourth insulating layer 141d. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The second and third redistribution layers 142b and 142c, among the redistribution layers 142a, 142b, and 142c, may substantially serve to redistribute the connection pad 122, and a formation material thereof may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of corresponding layers. For example, the redistribution layers 142a, 142b, and 142c may include ground (GND) pattern layers 142G, and may include power (PWR) patterns, signal (S) patterns, and the like. Particularly, at least a portion of the ground pattern layers 142G may be exposed through a side surface of the connection structure 140, and the exposed surface may be shielded by the metal layer 180. Here, the signal (S) patterns may include various signals except for the ground (GND) signals, the power (PWR) signals, and the like, such as data signals, and the like. In addition, the redistribution layers 142a, 142b, and 142c may include via pad patterns, electrical connection metal pad patterns, and the like.

The vias 143a, 143b, and 143c may electrically connect the redistribution layers 142a, 142b, and 142c, the connection pad 122, the passive components 125a and 125b, and the like, formed on different layers, to each other, resulting in an electrical path in the semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with a conductive material, or the conductive material may be formed along a wall of the vias. In addition, the vias 143a, 143b, and 143c may have all shapes known in the related art, such as a tapered shape, a cylindrical shape, and the like.

The underbump metal layer 160 may improve connection reliability of the electrical connection metal 170 to improve board level reliability of the semiconductor package 100A. The underbump metal layer 160 may be connected to the third redistribution layer 142c of the connection structure 140 exposed through the openings of the fourth insulating layer 141d. The underbump metal layer 160 may be formed in the openings by any known metallization method using the conductive material such as metal, but is not limited thereto.

The electrical connection metal 170 may physically and/ or electrically connect the semiconductor package 100A to an external power source. For example, the semiconductor package 100A may be mounted on the mainboard of the electronic device through the electrical connection metal 170. The electrical connection metal 170 may be formed of a conductive material, for example, a solder, or the like. However, this is only an example, and a material of each of the electrical connection metal 170 is not limited thereto. Each of the electrical connection metals 170 may be a land, a ball, a pin, or the like. The electrical connection metals 170 may be formed as a multilayer or single layer structure. When the electrical connection metal 170 is formed of a plurality of layers, the electrical connection metal may include a copper pillar and a solder. When the electrical connection metal is formed of the single layer, the electrical connection metal may include a tin-silver solder or copper. However, the electrical connection metal is only an example, and the present disclosure is not limited thereto. The number, an interval, a disposition form, and the like, of the electrical connection metals 170 are not particularly limited, but may be sufficiently modified depending on design particulars by those skilled in the art. For example, the electrical connection metals 170 may be provided in an amount of several tens to several thousands, or may be provided in an amount of several tens to several thousands or more or several tens to several thousands or less.

At least one of the electrical connection metals 170 may be disposed in a fan-out region of the semiconductor chip 120. The fan-out region may refer to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

The metal layer 180 may include a metal material such as copper (Cu), aluminum (Al), silver (Ag), tin (Sn), gold (Au), nickel (Ni), lead (Pb), titanium (Ti), or alloys thereof.

FIGS. 11A to 11D are schematic process drawings illustrating a manufacturing example of the semiconductor package of FIG. 9.

Figure 11A:
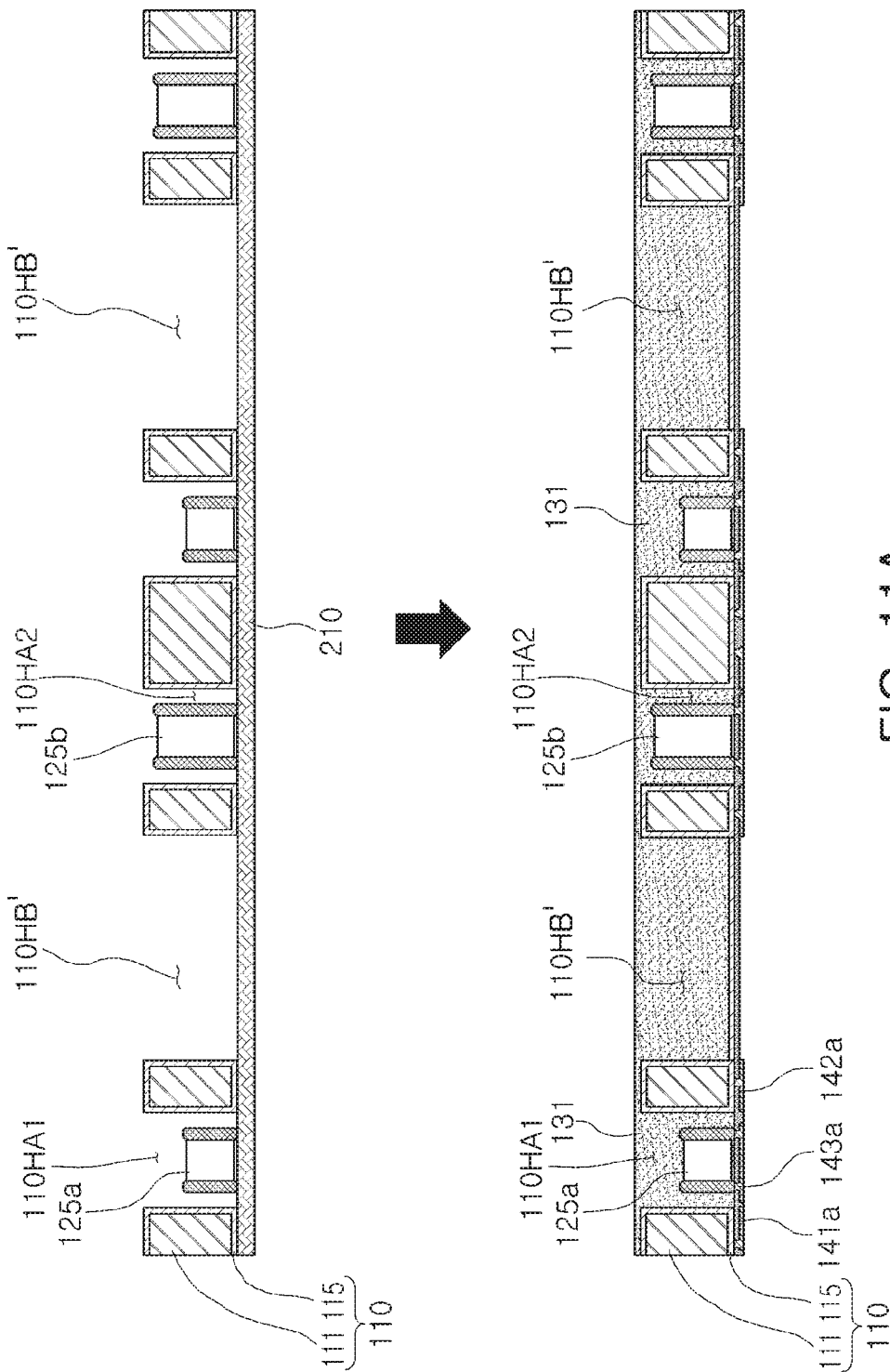

Referring to FIG. 11A, a frame 110 is prepared, first through-holes 110HA1 and 110HA2 and a preliminary second through-hole 110HB', penetrating an upper surface and a lower surface of the frame 110, are formed, a frame metal layer 115 is formed on an inner side wall and an outer side and an upper surface and a lower surface of each of the first through-holes 110HA1 and 110HA2 and the preliminary second through-hole 110HB', a first adhesive film 210 is attached to one side of the frame 110, and passive components 125a and 125b are disposed in the first through-holes 110HA1 and 110HA2. These process steps may be performed simultaneously for a plurality of unit packages (PA) by using a large-sized frame 110 so as to facilitate mass production. Then, the first encapsulant 131 is used to encapsulate the passive components 125a and 125b. After removing the first adhesive film 210, the first insulating layer 141a, the first redistribution layer 142a, and the first via 143a, which are a portion of the connection structure 140, may be formed in a lower portion of the passive components 125a and 125b. The first encapsulant 131 may encapsulate at least upper surfaces of the frame 110 and the passive components 125a and 125b, while filling spaces in the first through-holes 110HA1 and 110HA2 and the preliminary second through-hole 110HB'.

Figure 11B:
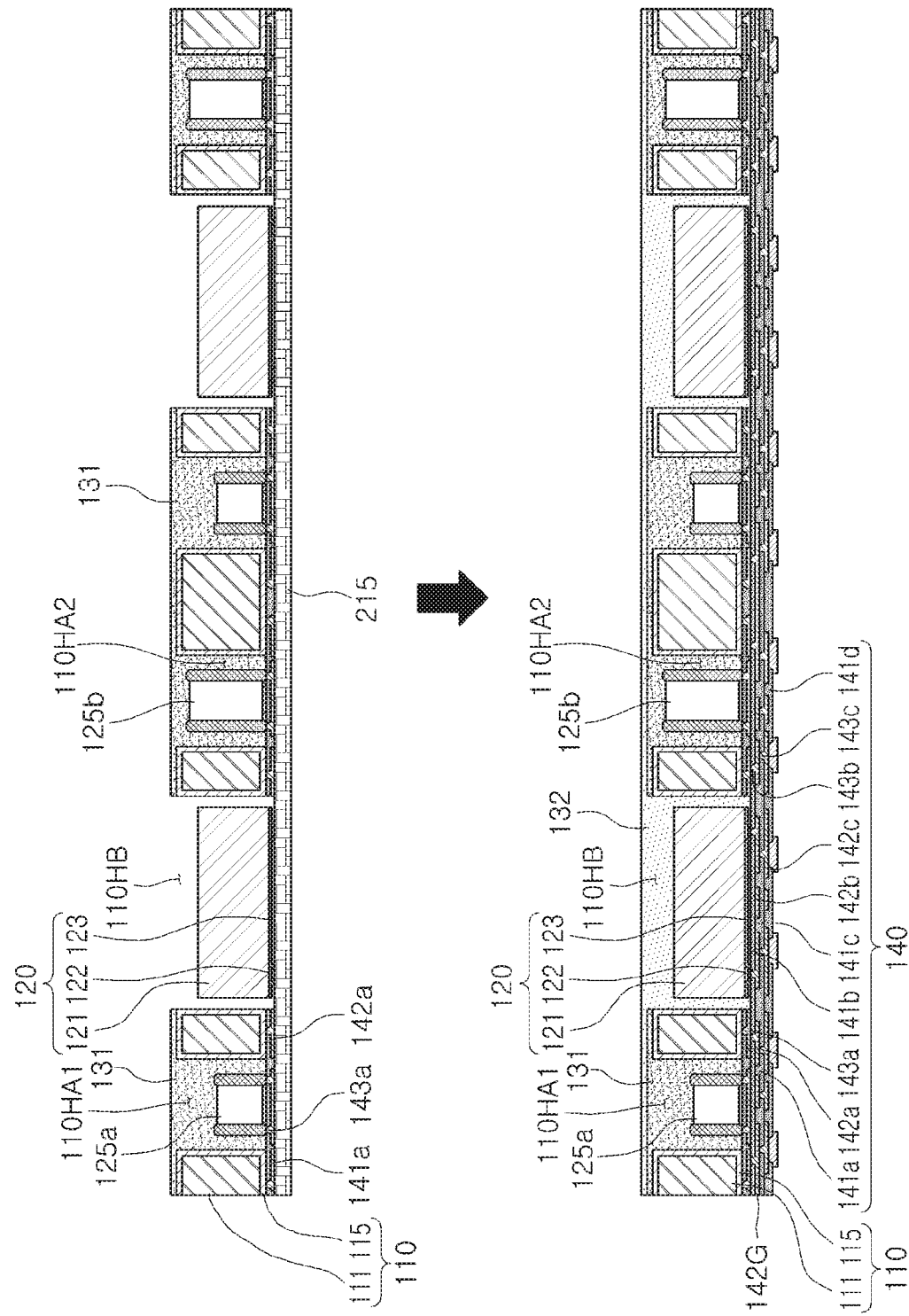

Referring to FIG. 11B, a second through-hole 110HB, penetrating the first encapsulant 131 and the first insulating layer 141a, is formed, a second adhesive film 215 is attached to one side of the frame 110, and a semiconductor chip 120 is disposed in the second through-hole 110HB. Then, the second encapsulant 132 is used to encapsulate the semiconductor chip 120, the second adhesive film 215 is removed, and the second to fourth insulating layers 141b, 141c, and 141d, the second and third redistribution layers 142b and 142c, and the second and third vias 143b and 143c are formed to form the connection structure 140. In addition, an opening for exposing at least a portion of the third redistribution layer 142c is formed in the fourth insulating layer 141d, and an underbump metal layer 160 is formed on the opening.

Referring to FIG. 11C, a third adhesive film 220 is formed on the second encapsulant 132, a sawing process is performed along a singulation line using a first sawing apparatus 230 at a boundary of the packages to remove a portion of the connection structure 140 to form a second region R2. The sawing process may be performed at a depth shallower than a depth from one surface of the connection structure 140, not facing the semiconductor chip 120, to a region in which the ground pattern layer 142G is disposed. That is, the ground pattern layer 142G may be not expose by the sawing process. For example, a portion of the fourth insulating layer 141d of the connection structure 140 may be sawed and the sawing process may be performed until the third insulating layer 141c is exposed. Next, a sawing process may be performed along a singulation line using a second sawing apparatus 235 at the boundaries of the packages, such that the portions of the first region R1 of the connection structure 140, the frame 110, and the first and second encapsulants 131 and 132 are removed. The first region R1 of the connection structure 140 is formed by the sawing process, and a portion of the ground pattern layer 142G in the first region R1 is exposed through a side surface. The second sawing apparatus 235 may be the same or different sawing apparatus as the first sawing apparatus 230, and the sawing process may be performed with a narrow width using a thinner blade than in the first sawing apparatus 230. However, the first and second sawing apparatuses 230 and 235 may be apparatuses including a laser in addition to a blade. The connection structure 140 may have a two-step structure having the first and second regions R1 and R2 having different widths by such a step cut method, and a step may be formed at the boundary of the first and second regions R1 and R2.

Figure 11D:
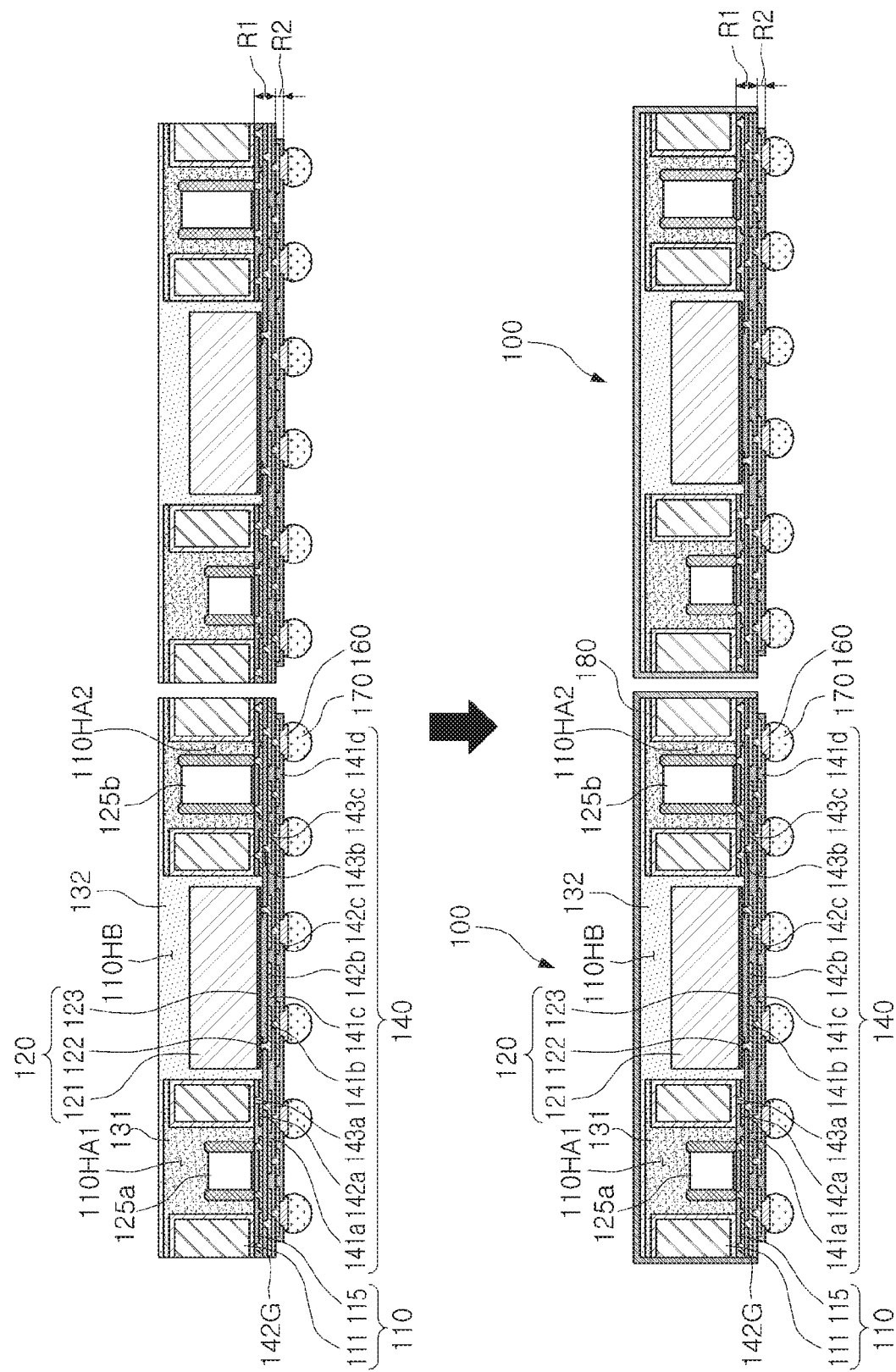

Referring to FIG. 11D, the electrical connection metal 170 is formed on the underbump metal layer 160. According to embodiments, the underbump metal layer 160 may be formed in the present step. In addition, in some cases, the electrical connection metal 170 is also formed up to the underbump metal layer, and the formation process of the electrical connection metal 170 may be performed by a customer company in a separate process, if necessary. Next, a metal layer 180 may be deposited by sputtering or spraying. The meal layer 180 may be deposited by transferring a metal material from above, and the metal layer 180 may not be formed on the second region R2 and on a lower surface to which the second region R2 is not attached due to the step of the first and second regions R1 and R2 of the connection structure 140. The metal layer 180 may cover the upper surface of the second encapsulant 132, and may cover portions or all of a side surface of the first and second encapsulants 131 and 132, the frame 110, and the first region R1 of the connection structure 140 including the ground pattern layer 142G on the side surface.

Figure 12:
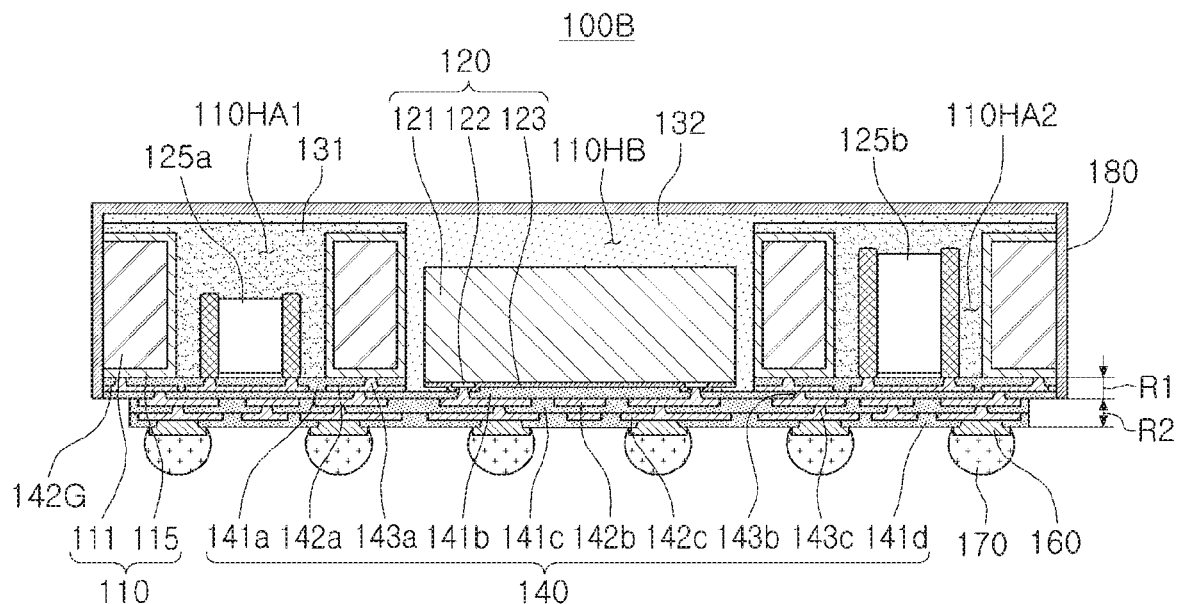
FIG. 12 is a schematic cross-sectional view illustrating another example of a semiconductor package.

FIG. 12 is a schematic cross-sectional view illustrating another example of a semiconductor package.

Referring to FIG. 12, in a semiconductor package 100B according to another example, the first region R1 of the connection structure 140 may include a first redistribution layer 142a and first and second insulating layers 141a and 141b, and the lower second region R2 may include second and third redistribution layers 142b and 142c and third and fourth insulating layers 141c and 141d. In addition, the first redistribution layer 142a may include the ground pattern layer 142G. In this case, the thickness of the first region R1 may be thinner than the thickness of the second region R2, but is not limited thereto. As described above, in the embodiments, ranges of the first and second regions R1 and R2 may be variously changed. Other configurations are substantially the same as those described in the above-described semiconductor package 100A and the like, and a detailed description thereof will be omitted.

Figure 13:
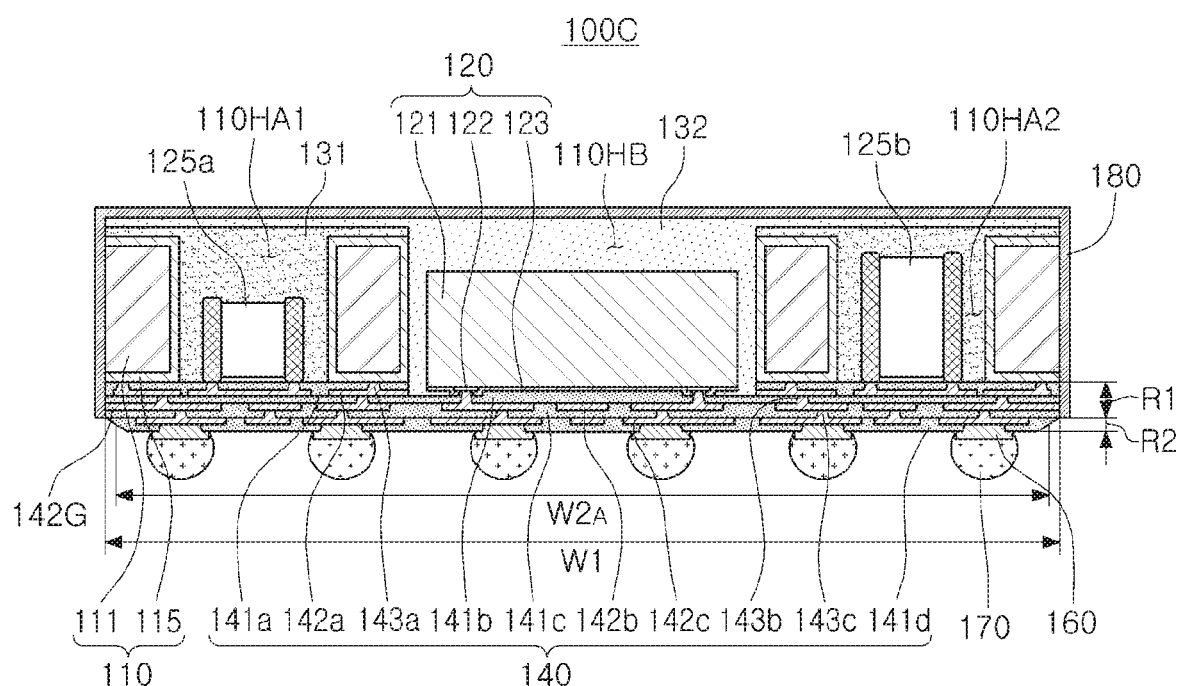
FIG. 13 is a schematic cross-sectional view illustrating another example of a semiconductor package.

FIG. 13 is a schematic cross-sectional view illustrating another example of a semiconductor package.

Referring to FIG. 13, in a semiconductor package 100C according to another example, the second region R2 of the connection structure 140 may have an inclined side surface. Accordingly, the width of the second region R2 may be narrowed from an upper surface, in contact with the first region R1 toward a lower surface thereof. Even in this case, the upper first region R1 may have a first width W1, and the lower second region R2 may have a second width $W2_A$, which is an average width smaller than the first width W1 in one direction. At the boundary of the first and second regions R1 and R2, a portion of the lower surface of the first region R1 may be exposed or not exposed to the lower portion. The semiconductor package 100C may be formed by a bevel cut method sawing process during the manufacturing process described above with reference to FIG. 11C. Other configurations are substantially the same as those described in the above-described semiconductor package 100A and the like, and a detailed description thereof will be omitted.

Figure 14:
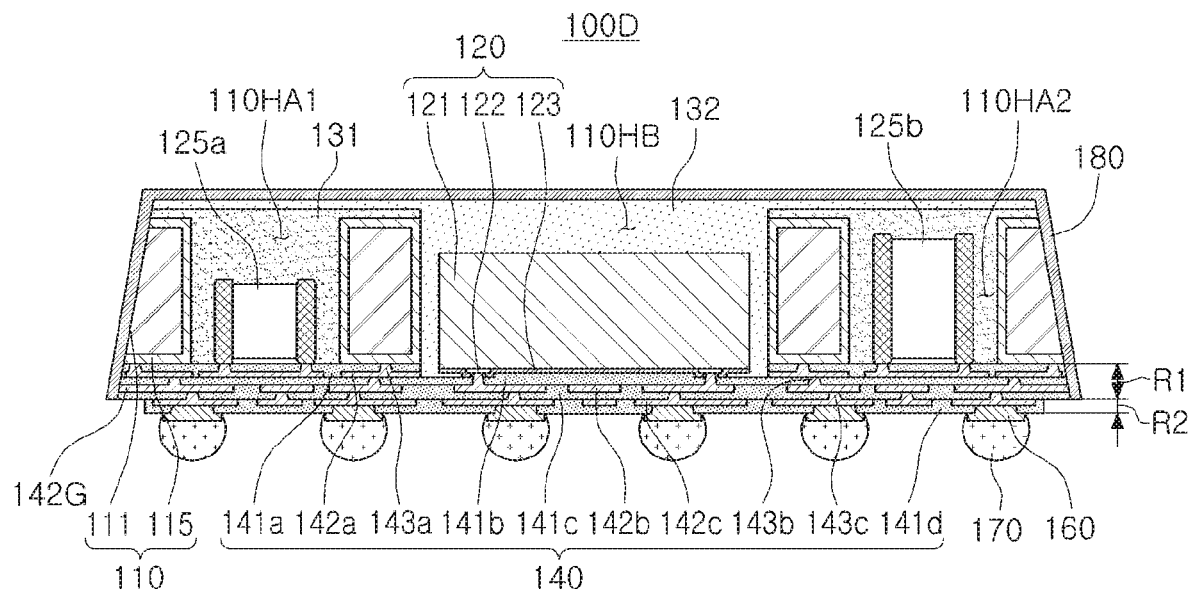
FIG. 14 is a schematic cross-sectional view illustrating another example of a semiconductor package.

FIG. 14 is a schematic cross-sectional view illustrating another example of a semiconductor package.

Referring to FIG. 14, in a semiconductor package 100D according to another example, each of the first and second encapsulants 131 and 132, the frame 110, and the first region R1 of the connection structure 140 may have an inclined side surface that widens while facing downwardly, such that an entirety thereof form a single trapezoidal cross-section. That is, the first and second encapsulants 131 and 132, the frame 110, and the first region R1 of the connection structure 140 may have a shape of a single quadrangular pyramid. The second region R2 of the connection structure 140 may have aside surface perpendicular to the upper surface of the semiconductor chip 120, and a step may be formed between the second region R2 and the first region R1. The semiconductor package 100D may be formed by a sawing process by a blade, a laser cutting process, or the like, during the manufacturing process described above with reference to FIG. 11C. In particular, in the semiconductor package 100D according to an example, since a portion of a side surface of the package 100D in which the metal layer 180 is formed to be inclined as described above, a step coverage of the metal layer 180 may be improved on the side surface of the package 100D. Other configurations are substantially the same as those described in the above-described semiconductor package 100A and the like, and a detailed description thereof will be omitted.

Figure 15:
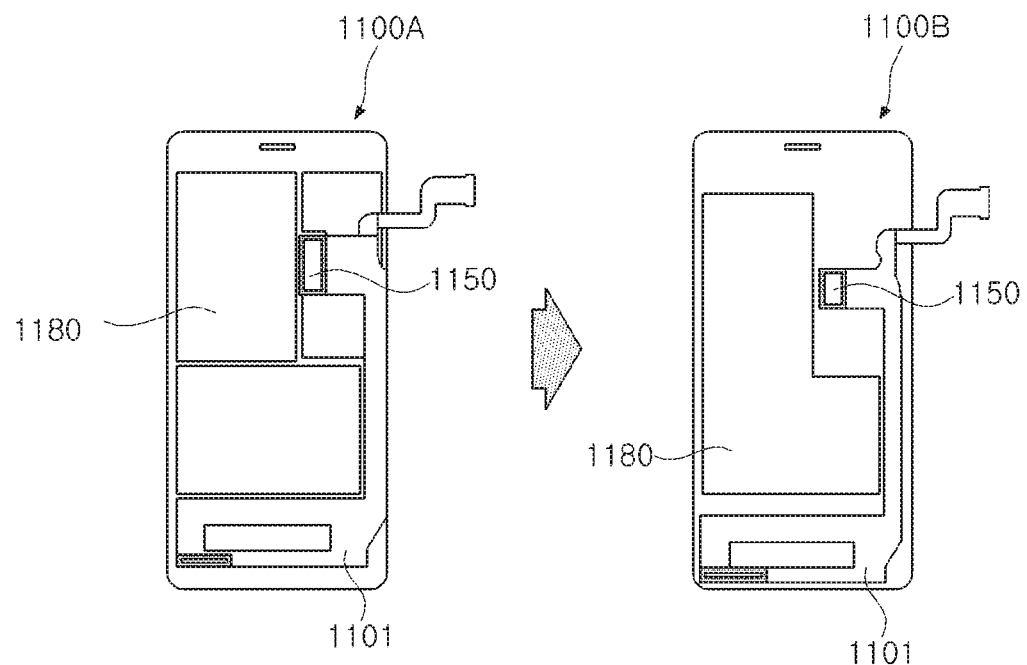
FIG. 15 is a schematic plan view illustrating an effect in a case in which the semiconductor package according to the present disclosure is applied to an electronic device.

FIG. 15 is a schematic plan view illustrating an effect in a case in which the semiconductor package according to the semiconductor package according to the disclosure is applied to an electronic device.

Referring to FIG. 15, recently, as a size of display for mobile devices 1100A and 1100B increases, the necessity of increasing battery capacity is increasing. As the battery capacity increases, an area occupied by the battery 1180 increases. In this regard, a size of a printed circuit board 1101 such as a mainboard is required to be reduced. Thus, due to a reduction in a mounting area of a component, an area occupied by a module 1150 including a power management integrated circuit (PMIC) and passive components is gradually decreased. In this case, when the semiconductor packages 100A, 100B, 100C, and 100D according to an embodiment is applied to the module 1150, a size is able to be significantly reduced. Thus, the area, which becomes smaller as described, above may be effectively used.

As set forth above, according to an embodiment in the present disclosure, a semiconductor package in which occurrence of defects is significantly reduced and shielding performance is improved may be provided.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

As set forth above, according to an embodiment in the present disclosure, a semiconductor package with significantly reduced defect occurrence and improved shielding performance may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a semiconductor chip having an active surface on which a connection pad is disposed and an inactive surface opposing the active surface;
a first encapsulant covering at least portions of each of the inactive surface and a side surface of the semiconductor chip;
a connection structure having a first region and a second region sequentially disposed on the active surface of the semiconductor chip, and including a redistribution layer electrically connected to the connection pad of the semiconductor chip and including a ground pattern layer; and
a metal layer disposed on an upper surface of the first encapsulant, and extending from the upper surface of the first encapsulant to a side surface of the first region of the connection structure,
wherein the first region of the connection structure has a first width, and the second region has a second width smaller than the first width, and
wherein an end of the metal layer is disposed on the side surface of the first region of the connection structure such that a side surface of the second region of the connection structure is not covered by the metal layer.

2. The semiconductor package of claim 1, further comprising a step formed at a boundary between the first region and the second region of the connection structure.

3. The semiconductor package of claim 1, wherein the ground pattern layer of the connection structure is disposed in the first region, and is connected to the metal layer.

4. The semiconductor package of claim 1, wherein the second region of the connection structure has an inclined side surface so as to be narrowed away from the first region.

5. The semiconductor package of claim 1, wherein each of the first encapsulant and the first region of the connection structure has an inclined side surface which is widened toward the second region.

6. The semiconductor package of claim 1, wherein the metal layer exposes the second region of the connection structure.

7. The semiconductor package of claim 1, wherein the first and second regions of the connection structure include an insulating layer, respectively, and
one of the insulating layers covers the redistribution layer.

8. The semiconductor package of claim 7, wherein a portion of the insulating layer of the first region is exposed from a lower surface between the first and second regions of the connection structure.

9. The semiconductor package of claim 1, wherein one of the first and second regions includes the redistribution layer, and another of the first and second regions includes another redistribution layer.

10. The semiconductor package of claim 1, wherein the second region of the connection structure includes a passivation layer having openings exposing portions of a lowermost redistribution layer of the connection structure.

11. A semiconductor package, comprising:
a semiconductor chip having an active surface on which a connection pad is disposed and an inactive surface opposing the active surface;
a first encapsulant covering at least portions of each of the inactive surface and a side surface of the semiconductor chip;
a connection structure having a first region and a second region sequentially disposed on the active surface of the semiconductor chip, and including a redistribution layer electrically connected to the connection pad of the semiconductor chip and including a ground pattern layer; and
a metal layer disposed on an upper surface of the first encapsulant, and extending from the upper surface of the first encapsulant to a side surface of the first region of the connection structure,
wherein the first region of the connection structure has a first width, and the second region has a second width smaller than the first width, and
wherein the semiconductor package further comprises a frame disposed on the connection structure, and having a first through-hole in which the semiconductor chip is disposed.

12. The semiconductor package of claim 11, wherein the metal layer covers a side surface of the frame, and extends to the first region of the connection structure.

13. The semiconductor package of claim 11, wherein the frame further has a second through-hole, and the semiconductor package further comprises one or more passive components disposed in the second through-hole.

14. The semiconductor package of claim 13, wherein the frame comprises a frame metal layer disposed on an inner side wall of the second through-hole, wherein the frame metal layer is electrically connected to the metal layer.

15. The semiconductor package of claim 13, further comprising a second encapsulant covering at least portions of an upper surface and a side surface of each of the passive components, and
wherein the first encapsulant covers an upper surface of the second encapsulant.

16. The semiconductor package of claim 15, wherein each of the first encapsulant, the second encapsulant, the frame, and the first region of the connection structure has an inclined side surface which is widened toward the second region.

17. The semiconductor package of claim 11, wherein the frame comprises a frame metal layer disposed on at least an inner side wall of the first through-hole,
wherein the frame metal layer is electrically connected to the metal layer.

18. A semiconductor package, comprising:
a semiconductor chip having an active surface on which a connection pad is disposed and an inactive surface opposing the active surface;
an encapsulant covering at least portions of each of the inactive surface and a side surface of the semiconductor chip;
a connection structure having first and second regions sequentially disposed on the active surface of the semiconductor chip and having different widths, and including a redistribution layer electrically connected to the connection pad of the semiconductor chip and including a ground pattern layer; and
a metal layer disposed on an upper surface of the encapsulant, and extending from the upper surface of the encapsulant to a side surface of the first region of the connection structure, and connected to the ground pattern layer located in the first region,
wherein an end of the metal layer is disposed on the side surface of the first region of the connection structure, and
wherein the metal layer exposes the second region of the connection structure.

19. The semiconductor package of claim 18, wherein the end of the metal layer is disposed farther from the upper surface of the encapsulant than the ground pattern layer.

20. The semiconductor package of claim 18, further comprising:
a frame disposed on the connection structure, and having a through-hole in which the semiconductor chip is disposed; and
a frame metal layer disposed on at least an inner side wall of the through-hole,
wherein the frame metal layer is electrically connected to the metal layer.

* * * * *